(12) United States Patent
Hurwitz

(10) Patent No.: US 11,841,386 B2
(45) Date of Patent: Dec. 12, 2023

(54) APPARATUS FOR AND METHOD OF CORRECTING FOR A GAIN ERROR RESULTING FROM THE POSITION OF A POLE OR ZERO IN A TRANSFER FUNCTION AND TO A CURRENT MEASUREMENT DEVICE INCLUDING SUCH AN APPARATUS

(71) Applicant: Analog Devices International Unlimited Company, Limerick (IE)

(72) Inventor: Jonathan Ephraim David Hurwitz, Edinburgh (GB)

(73) Assignee: Analog Devices International Unlimited Company, Limerick (IE)

( * ) Notice: Subject to any disclaimer, the term of this patent is extended or adjusted under 35 U.S.C. 154(b) by 48 days.

(21) Appl. No.: 17/467,043

(22) Filed: Sep. 3, 2021

(65) Prior Publication Data
US 2022/0021366 A1   Jan. 20, 2022

Related U.S. Application Data

(63) Continuation-in-part of application No. 16/007,551, filed on Jun. 13, 2018, now Pat. No. 11,125,784.

(51) Int. Cl.
*G01R 19/25* (2006.01)
*H03H 7/06* (2006.01)
(Continued)

(52) U.S. Cl.
CPC ....... *G01R 19/2506* (2013.01); *G01R 15/181* (2013.01); *H03B 5/24* (2013.01); *H03H 7/06* (2013.01)

(58) Field of Classification Search
CPC ........ G01R 1/44; G01R 15/18; G01R 15/181; G01R 19/0092; G01R 19/12;
(Continued)

(56) References Cited

U.S. PATENT DOCUMENTS 5,534,820 A   7/1996 Tupper et al.
6,094,044 A   7/2000 Kustera et al.
(Continued)

FOREIGN PATENT DOCUMENTS

EP           2868285 A1      5/2015
WO    WO-2013038176 A2      3/2013
WO           2020104794      5/2020

OTHER PUBLICATIONS

"U.S. Appl. No. 16/007,551, Final Office Action dated Jan. 11, 2021", 13 pgs.
(Continued)

*Primary Examiner* — Steven L Yeninas
(74) *Attorney, Agent, or Firm* — Schwegman Lundberg & Woessner, P.A.

(57) ABSTRACT

The response of a coil based current measuring circuit is often proportional to frequency. To correct for this a low pass or integrating function is applied to the response to linearize it. The low pass filter is made from real resistors and capacitors, and tolerances in their values significantly affect the estimate of current. The present approach can provide a way of addressing such problems. This allows consumers of electricity to have confidence in the accuracy of, for example, their electricity meter.

20 Claims, 18 Drawing Sheets

(51) Int. Cl.
*G01R 15/18* (2006.01)
*H03B 5/24* (2006.01)

(58) Field of Classification Search
CPC .... G01R 19/2506; G01R 19/32; G01R 21/14; H03H 7/06; H03M 1/06; H03M 1/0602; H03M 1/0626; H03M 1/124; H03M 1/1245; H03M 1/34; H03M 1/46
See application file for complete search history.

(56) References Cited

U.S. PATENT DOCUMENTS

| | | | |
|---|---|---|---|
| RE36,987 E | | 12/2000 | Tupper et al. |
| 6,366,076 B1 | | 4/2002 | Karrer et al. |
| 7,024,172 B1 | * | 4/2006 | Murphy .................. H04B 1/30 |
| | | | 455/313 |
| 8,810,263 B1 | | 8/2014 | Wilson et al. |
| 9,787,320 B1 | * | 10/2017 | Onishi .................. H03M 3/484 |
| 11,125,784 B2 | | 9/2021 | Hurwitz |
| 2004/0162691 A1 | | 8/2004 | Pupalaikis et al. |
| 2006/0232264 A1 | | 10/2006 | Jurisch |
| 2010/0131219 A1 | | 5/2010 | Kenly et al. |
| 2011/0260711 A1 | | 10/2011 | Badegruber et al. |
| 2011/0307208 A1 | | 12/2011 | Graf et al. |
| 2012/0286769 A1 | | 11/2012 | Torti |
| 2012/0293166 A1 | * | 11/2012 | Lee ...................... G01D 5/2046 |
| | | | 324/207.17 |
| 2014/0171935 A1 | * | 6/2014 | Digmann ........... A61B 18/1206 |
| | | | 606/34 |
| 2014/0320112 A1 | | 10/2014 | Nodera et al. |
| 2016/0291060 A1 | | 10/2016 | Wood et al. |
| 2017/0168094 A1 | * | 6/2017 | Chikamatsu .......... G01R 15/18 |
| 2017/0219632 A1 | * | 8/2017 | Teppan .................. G01R 33/04 |
| 2018/0252748 A1 | | 9/2018 | Wood et al. |
| 2019/0257864 A1 | | 8/2019 | Mcphalen |
| 2019/0383859 A1 | | 12/2019 | Hurwitz |

OTHER PUBLICATIONS

"U.S. Appl. No. 16/007,551, Non Final Office Action dated Jun. 9, 2020", 15 pgs.

"U.S. Appl. No. 16/007,551, Notice of Allowance dated May 19, 2021", 9 pgs.

"U.S. Appl. No. 16/007,551, Response filed Apr. 9, 2021 to Final Office Action dated Jan. 11, 2021", 13 pgs.

"U.S. Appl. No. 16/007,551, Response filed Oct. 9, 2020 to Non Final Office Action dated Jun. 9, 2020", 10 pgs.

U.S. Appl. No. 16/007,551/U.S. Pat. No. 11,125,784, filed Jun. 13, 2018, Correcting for a Gain Error Resulting From the Position of a Pole or Zero in a Transfer Function of a System.

"International Application Serial No. PCT/EP2022/074514, International Search Report dated Dec. 6, 2022", 4 pgs.

"International Application Serial No. PCT/EP2022/074514, Written Opinion dated Dec. 6, 2022", 7 pgs.

"International Application Serial No. PCT/EP2022/074660, International Search Report dated Feb. 28, 2023", 6 pgs.

"International Application Serial No. PCT/EP2022/074660, Written Opinion dated Feb. 28, 2023", 5 pgs.

* cited by examiner

APPARATUS FOR AND METHOD OF CORRECTING FOR A GAIN ERROR RESULTING FROM THE POSITION OF A POLE OR ZERO IN A TRANSFER FUNCTION AND TO A CURRENT MEASUREMENT DEVICE INCLUDING SUCH AN APPARATUS

CLAIM OF PRIORITY

This application is a Continuation-in-Part of U.S. patent application Ser. No. 16/007,551, filed on Jun. 13, 2018, which is hereby incorporated by reference herein in its entirety.

FIELD

The present disclosure relates to an apparatus for and a method of detecting key features, such as the positions of the poles and zeros or gain at a specific frequency, in the transfer function of a signal processing apparatus and using this information to apply a correction.

BACKGROUND

It is known that signals from transducers typically need to be low pass or high pass filtered. Often the circuits are arranged such that the position of the breakpoint in the transfer function, i.e. the position of poles or zeros in the corresponding S-plane diagram, are well away from the frequencies of interest. Under such conditions process and temperature variations in relation to capacitive, resistive or inductive components tend not to be a bother in practice. However there are some classes of transducer, such as Rogowski coils where the voltage from such a transducer is directly proportional to the rate of change of magnetic field where it would be desirable to provide compensation or correction for component variation in signal processing stages. It is often desirable to linearize the frequency response of such a transducer by following it with an integrator, which is effectively a low pass filter whose pole (break point or −3 dB point are other terms that may be used) is set to a relatively low frequency, lower than the fundamental frequency of interest. In such an arrangement process and temperature variations can affect the position of the pole in the transfer function response of the low pass filter, and this can have significant effects on the measurement accuracy of, for example, a current measurement circuit comprising a combination of a current transformer and a low pass filter.

SUMMARY

The response of a coil based current measuring circuit (such as one that includes a Rogowski coil or an air-corrected current transformer) is often proportional to frequency. To correct for this a low pass or integrating function is applied to the response to linearize it. The low pass filter is made from real resistors and capacitors, and tolerances in their values significantly affect the estimate of current. This disclosure relates to a way of addressing such problems. This allows consumers of electricity to have confidence in the accuracy of, for example, their electricity meter. Whilst this disclosure focuses particularly on different apparatus configured for use with a coil-based current transducer that has a particular frequency response to be corrected, it should be appreciated that the apparatus could be used to correct for the frequency response of any other type of device/component having a similar frequency response to that of a coil-based current transducer, or having a different frequency response to that of a coil-based current transducer (for example, having the opposite type of frequency response, in which case the apparatus may include a high-pass filter rather than the low pass filter that issued in the examples described in the detailed description).

According to a first aspect of the present disclosure there is provided an apparatus comprising a filter comprising filter components, an input for receiving an input signal and an output for outputting a filtered signal, wherein the filter components comprise a first resistor and a first capacitor; an analog-to-digital converter, ADC, configured to receive and digitally convert the filtered signal; and a reference generator coupled to the ADC to supply a reference voltage to the ADC, wherein the reference generator comprises filter tracking components comprising at least one of: a second resistor that is matched to the first resistor; and a second capacitor that is matched to the first capacitor, wherein the reference generator is configured to generate the reference voltage to be dependent on the tracking components in such a way that a change in a frequency response of the filter caused by a change in value of at least one of the filter components is substantially corrected by a change in the digital conversion of the filtered signal resulting from a change in the reference voltage. The apparatus may therefore have a frequency response that is substantially independent of changes in the values of the filter components over an operational frequency range.

The reference voltage may be dependent on an inverse of the tracking components such that an increase in value of the filter tracking components reduces the reference voltage.

The second resistor may be formed using the same fabrication process as the first resistor and is notionally identical to the first resistor and/or the second capacitor may be formed using the same fabrication process as the first capacitor and is notionally identical to the first capacitor. Such "notionally identical" impedance components will have matched corresponding impedance values (e.g., resistance value or capacitance value, depending on the type of impedance component) such as to the extent possible given manufacturing process variations of a semiconductor manufacturing or other manufacturing process used to fabricate such impedance components.

Alternatively, the second resistor may be formed using the same fabrication process as the first resistor and is a scaled version of the first resistor and/or the second capacitor may be formed using the same fabrication process as the first capacitor and is a scaled version of the first capacitor.

The filter may be a low pass RC filter or the filter may be a leaky integrator.

The reference generator may comprise a switched capacitor arrangement comprising the second capacitor.

The input of the filter may be suitable for coupling to a coil based current transducer.

The coil based current transducer may be a Rogowski coil or an air-cored current transformer.

According to a second aspect of the present disclosure there is provided an apparatus comprising: a signal processing circuit comprising an input for receiving a first signal, an output for outputting a second signal and a signal path for signal to pass from the input to the output, the signal processing circuit comprising: a filter in the signal path, the filter comprising filter components that comprise a first resistor and a first capacitor; and a gain stage in the signal path; wherein the gain stage comprises filter tracking components comprising at least one of: a second resistor that is matched to the first resistor; and a second capacitor that is matched to the first capacitor, and wherein the gain stage is configured to have a gain that is dependent on the second resistor and the second capacitor in such a way that a change in frequency response of the filter caused by a change in value of at least one of the filter components is substantially corrected by a change in the gain of the gain stage. As a result, the apparatus may have a frequency response that is substantially independent of changes in the values of the filter components over an operational frequency range.

The gain of the gain stage may be substantially proportional to the filter tracking components, such that an increase in a value of the second resistor or the second capacitor results in an increase in the gain of the gain stage.

The second resistor may be formed using the same fabrication process as the first resistor and is notionally identical to the first resistor and/or the second capacitor may be formed using the same fabrication process as the first capacitor and is notionally identical to the first capacitor.

Alternatively, the second resistor may be formed using the same fabrication process as the first resistor and is a scaled version of the first resistor and/or the second capacitor may be formed using the same fabrication process as the first capacitor and is a scaled version of the first capacitor.

The filter may be a low pass RC filter or a leaky integrator.

The gain stage may comprise a switched capacitor arrangement comprising the second capacitor. The gain stage may comprise an inverting amplifier stage comprising the switched capacitor at its input.

The input of the filter may be suitable for coupling to a coil based current transducer.

The coil based current transducer may be a Rogowski coil or an air-cored current transformer.

According to a third aspect of the present disclosure there is provided a system for measuring current, the system comprising: an input to a signal path for receiving a signal indicative of a current to be measured; a filter in the signal path, wherein the filter is arranged to filter a signal received at the input to the signal path, and wherein the filter comprises at least one filter component; an analog-to-digital converter, ADC, arranged to digitally convert the filtered signal, wherein the ADC comprises a first input for receiving the filtered signal and a second input for receiving a reference voltage; and a filter tracking circuit comprising at least one tracking component that is matched to the at least one filter component, wherein the filter tracking circuit is arranged to modify a signal at the first input or the second input of the ADC in way that is dependent on a value of the at least one tracking component, such that a change in frequency response of the filter caused by a change in value of the at least one filter component is substantially corrected by a change in digital conversion performed by the ADC.

The at least one filter component may comprise one or more of: a first resistor; a first capacitor; a first inductor, wherein the at least one tracking component comprises one or more of: a second resistor that is matched to the first resistor; a second capacitor that is matched to the first capacitor; a second inductor that is matched to the first inductor.

The filter tracking circuit may be a gain stage located in the signal path that is arranged to apply a gain to the signal passing through the signal path, wherein the gain is dependent on the value of the sat least one tracking component.

The gain of the filter tracking circuit may be substantially proportional to the value of the at least one tracking component.

The filter tracking circuit may be a reference generating circuit configured to generate the reference voltage in such a way that is dependent on the value of the at least one tracking component.

The reference voltage may be substantially inversely proportional to the value of the at least one tracking component.

The system may further comprise a coil based current transformer coupled to the input to the signal path.

According to a fourth aspect of the present disclosure there is provided an apparatus for estimating or correcting for a gain error resulting from component variation which may modify a position of a pole or a zero in a transfer function of a system, such as a signal processing apparatus. The signal processing apparatus may, for example, comprise a low pass filter or an integrator arranged to receive an input signal. The low pass filter or integrator may have at least one pole in its transfer function. Other filter functions or more complex filter functions may include one or more zeros in the transfer function. The apparatus further comprises a characterization circuit comprising components which are mapped to those in the filter or integrator. In this context "mapped" may mean that they are the same, or that the values are scaled in some known way. The same scaling need not be applied to each class of components. Thus, for example, capacitors in the characterization circuit may be formed to be smaller than equivalent capacitors in the filter or integrator. However the relative ratio between the sizes of the capacitors is known, as it can be set by the area allocated to a capacitor during a semiconductor/integrated circuit fabrication process. Similarly resistors in the characterization circuit need not have the same value as resistors in the filter path. It is merely sufficient that the relevant scaling factors are known and predictable. That said, there can be certain advantages if the resistors and capacitors in the filter and in the characterization circuit are the same size (value), or that at least every component in one circuit has a corresponding component of the same size in the other circuit. As a consequence of this matching or scaling there is a predictable relationship between the positions of one or more poles or one or more zeros in the transfer function of the characterization circuit and one or more poles or zeros in the transfer function of the filter.

Advantageously there is further provided a processing circuit arranged to interrogate the function of the characterization circuit and estimate the transfer function of the filter or a correction to the filter response based on the observed operation of the characterization circuit.

The characterization circuit may, for example, include an RC circuit or a plurality of RC combinations configured to form an oscillator. The frequency of the oscillator can then be monitored, for example by digitizing and then analyzing using a digital data processor, to determine the frequency of oscillation and hence the time constant of the RC circuit or circuits. As a further alternative the RC circuit may be driven with a known signal, such as a signal produced by a digital to analog converter and the output from the RC circuit may be digitized by an analog to digital converter such that the transfer function of the circuit can be accurately measured. In such an arrangement the analog to digital converter may be used to sample both the output of the characterization circuit and the input to the characterization circuit such that scaling errors in the measurement chain cancel out.

According to a fifth aspect of the present disclosure there is provided a method of correcting for at least one of a gain error and a phase error resulting from a position of a pole or a zero in a transfer function of a signal processing circuit, the method being implemented is a circuit comprising:
  a) a first circuit arranged to process an input signal and to output a processed analog output; and
  b) a characterization circuit formed such that it has R, L or C components in circuits formed therein where the values of the R, L or C components of the circuits in the characterization circuit are identical to or scaled versions of corresponding R, L or C groupings in the first circuit.

As a result the transfer functions of a first circuit and the characterization circuits are related in a known way.

The method comprises exercising the characterization circuit to determine key parameters, such as component values or the time constant or transfer function of the characterization circuit. The method further comprising using the estimate of the time constant or the transfer function of the characterization circuit or a component value estimate using the characterization circuit to estimate or account for a deviation of the transfer function of the signal processing circuit from a nominal transfer function, or to estimate the actual transfer function of the signal processing circuit. Where a deviation is calculated, a correction may be made available for correcting the output of the signal processing circuit.

According to a further aspect of the present disclosure there is provided a current measuring circuit comprising a Rogowski coil or an air core current transformer and a low pass RC filter. The apparatus further comprises a circuit or other suitable means for estimating a cut-off frequency of the RC filter such that the response provided by the filter at any frequency or to any input signal, such as a transient, can be accurately calculated. The current measurement circuit further comprises a second circuit comprising at least one resistor, capacitor or a resistor-capacitor combination forming an RC circuit matched to the RC filter such they share temperature and/or manufacturing process variations. The current measuring circuit further comprises an interrogation circuit for interrogating the performance of a second circuit so as to characterize the values of the R, C or the RC time constant within the second circuit. The result of the characterization can be used to calculate or modify the attenuation factor of the filter at a desired frequency, or to apply a gain and/or phase correction in a signal processing chain. In general, it is likely to be convenient to characterize a response of an RC circuit such that the individual values of R and C do not need to individually be determined. However, in some circumstances the value of a component may be sufficiently specified or known (for example because it has been calibrated or trimmed, or because it is a discrete component which is sufficiently stable and whose value is known to sufficient accuracy) such that it becomes useful to estimate the value of other components explicitly. For example, if the values of the resistors in the filter or other signal processing circuit and the characterization circuit were provided by accurate off-chip components (or has been measured) then determining the RC time constant also causes C to be accurately determined.

According to a further aspect of the present disclosure there is provided a method of estimating the magnitude of a surge event, the method comprising monitoring the evolution of voltage as a function of time of a filter, and using knowledge of the RC product to estimate the magnitude of the surge event.

The filter can be any form of filter, but for robustness will typically be a low order RC filter. The surge event may be an overvoltage event. The filter may be already connected to a conductor whose voltage is being monitored. Alternatively the filter may be connected by way of a potential divider, such as a resistor based potential divider. The filter may also be connected to, or be formed as a part of a capacitive potential divider. Such a divider may be galvanically connected to or galvanically isolated from the conductor.

The surge event may be current surge and the response of a current transducer may be filtered. The techniques discussed herein can also be used to monitor voltage surges.

In the electrical domain the teachings used here can be applied in meters, protective relays, circuit breakers, motor controllers, inverters, generators, cooling and heating systems, actuators and so on. It can also be used in arc fault detection, short circuit detection and the like.

The teachings can also be extended to mechanical and fluid systems where components have a low pass filter response to estimate transient pressure changes, load forces, fluid flows and the like.

There is further provided a surge estimator comprising a filter whose response is known to a required precision and a processor for monitoring the output of the filter as a function of time to estimate the magnitude of a surge event.

The method further comprises estimating the RC product of the RC filter. The estimate may be made using a replica circuit which can be examined to estimate the response of the filter.

Illustrative Aspects of the Disclosure

1. An apparatus for estimating a gain error resulting from
  a position of a pole or
  a zero in a transfer function, the apparatus comprising:
    a filter in a signal path, the filter having at least one pole or zero in its transfer function;
    a characterization circuit comprising matched components such that there is a predictable relationship between the position of at least one pole or zero in the transfer function of the characterization circuit and the transfer function of the filter; and
    a processing circuit arranged to estimate a correction value for the filter response based on the operation of the characterization circuit.
2. The apparatus of clause 1, in which the filter is a low pass RC filter.
3. The apparatus of clause 1, in which the filter is a leaky integrator.
4. The apparatus of clause 1, in which the characterization circuit comprise an oscillator formed of at least one RC stage.
5. The apparatus of clause 1, in which the characterization circuit comprises a further filter, and a signal generator to provide a test signal to the further filter.
6. The apparatus of clause 5, in which the signal generator is one of
  a) a free running oscillator set to a nominal oscillation frequency such that a comparison of the oscillator signal and the output of the filter allows the frequency of the pole or zero of the filter to be identified with a desired accuracy;
  b) a digital to analog converter driven so as to provide the test signal.
7. The apparatus of clause 1, in which the filter comprises R and C components, and the characterization circuit comprise R and C components, where the components are formed using the same fabrication process and are notionally identical.

8. The apparatus of clause 1, in which the filter comprises R and C components, and the characterization circuit comprises R and C components, where the components are formed using the same fabrication process and are scaled versions of each other.
9. The apparatus of clause 8, further comprising a swap circuit for swapping the filter and the characterization circuits.
10. A current measurement apparatus including an inductive current sensor and the apparatus of clause 1, and a variable gain amplifier, a variable attenuator or a multiplier responsive to the apparatus for estimating gain error to apply a correcting gain.
11. A method of correcting for a gain error resulting from a position of a pole or a zero in a transfer function of a signal processing circuit, the method being implemented in a circuit comprising:
  a first circuit arranged to process an input signal; and
  a characterization circuit formed such that it has RC, RL or LC circuits formed therein where the values of RC, RL or LC circuits in the characterization circuit are identical to or are a scaled version of corresponding RC, RL or LC groupings in the first circuit such that the transfer functions of the first circuit and the characterization circuit are related in a known way;
  the method comprising exercising the characterization circuit to determine the time constants or transfer function of the components in the characterization circuit.
12. The apparatus of clause 11, further comprising using the estimate to calculate a deviation of transfer function of the signal processing circuit from a nominal transfer function, and making said calculation available for correcting an output of the signal processing circuit.
13. The apparatus of clause 12, further comprising using the estimate to characterize the transfer function of the signal processing circuit.
14. The apparatus of clause 11, further comprising driving the characterization circuit with a known test signal and monitoring the output of the characterization circuit so as to estimate its transfer function.
15. A current measuring circuit comprising an inductor based current transducer and a low pass RC filter, and an apparatus for estimating a response of the filter, such that the attenuation provided by the filter at a frequency can be accurately calculated, the current measurement circuit further comprising a second circuit comprising at least one RC circuit matched to the RC filter such that they share temperature and/or manufacturing process variations, and a circuit for interrogating the performance of the second circuit so as to characterize the RC time constant within the second circuit and to use the result of the characterization to calculate or modify the attenuation factor of the filter at the frequency.
16. The apparatus of clause 15, further comprising a surge detector, and a processor arranged to monitor the evolution of voltage over time, and to use this and knowledge of a transfer function of the filter to estimate the magnitude of the surge.
17. The apparatus of clause 16, in which the surge detector is connected upstream of the filter.
18. A surge estimator comprising
  a transducer for measuring a voltage or a current;
  a filter for filtering an output of the transducer;
  a characterization circuit for estimating the transfer function of the filter; and
  a processor responsive to the output of the filter and the characterization circuit for estimating the magnitude of a surge event.
19. the surge estimator of clause 18, wherein the filter is an RC filter, and the characterization circuit further comprises additional RC components scaled by a known scaling factor to the RC component of the RC filter.
20. An electricity monitoring or measurement system including the apparatus of clause 1.

BRIEF DESCRIPTION OF THE DRAWINGS

Example embodiments of the present disclosure will now be described, by way of non-limiting example only, with reference to the accompanying figures in which.

DESCRIPTION OF SOME EMBODIMENTS

Figure 1:
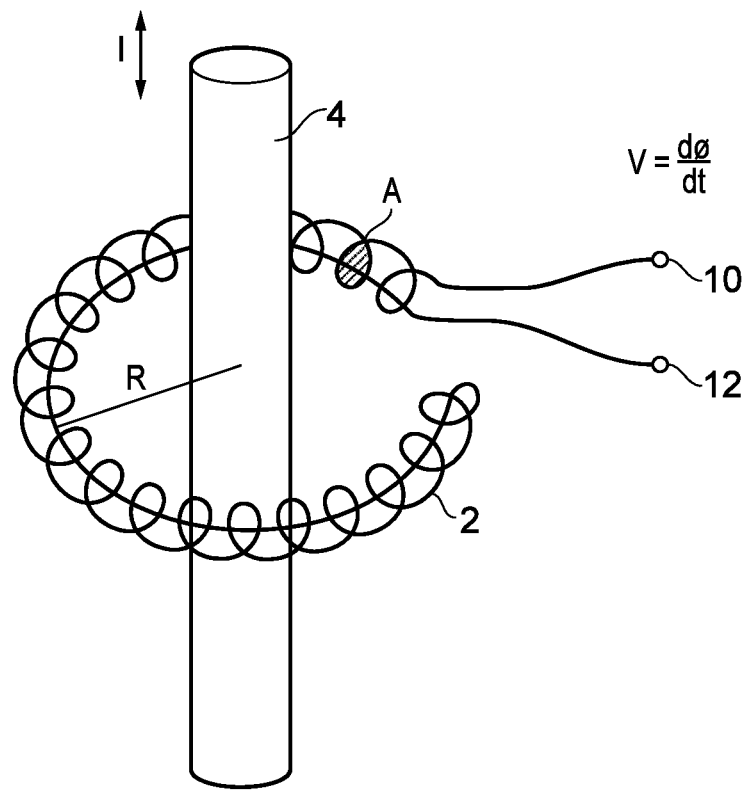
FIG. 1 schematically illustrates a Rogowski coil encircling a current carrying conductor.
Figure 2:
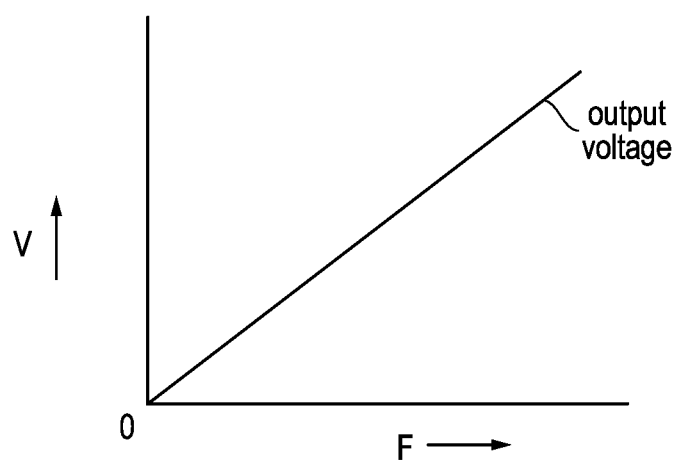
FIG. 2 is a plot of the voltage developed across a Rogowski coil as a function of frequency for a constant magnitude alternating current.

FIG. 1 is a schematic illustration of the current measuring circuit in the form of a Rogowski coil 2. Such a current transducer can be used to measure a wide range of alternating currents, such as current supplied to a domestic dwelling or the currents around a distribution grid from electricity generation stations to users. The Rogowski coil comprises a coil 2 of cross sectional area A which encircles a current carrying conductor 4 which, in use, carries an alternating current I. The alternating current I in the conductor 4 induces a voltage a the output of the Rogowski coil $$V(T) = \frac{AN}{2\pi R}\mu_o \cdot \frac{dI}{dt} \qquad \text{Equation 1}$$

where
A is the cross sectional area of the coil (see FIG. 1)
N is the number of turns of the coil
R is the radius of the coil around the conductor
$\mu_o = 4\pi \times 10^{-7}$ Hm$^{-1}$
I=current A consequence of this is that if the conductor 4 were to carry an alternating current of a constant peak-to-peak or RMS value but the frequency of that current was swept from low frequency to high frequency then the voltage V developed across the Rogowski coil would increase linearly with frequency, as schematically illustrated in FIG. 2.

This property of the Rogowski coil can be unhelpful since mains born load currents are generally quite low frequency, say 50 or 60 Hz whereas noise components can be at much higher frequencies, possibly running into the hundreds of kHz or above. It can therefore be seen that such a response gives a disproportionate amount of weight to a noise signal of low magnitude but high frequency compared to a response of the desired load current having a much higher magnitude but a much lower frequency.

Ideally the output voltage of the Rogowski coil 2 would depend only on the magnitude of the current I through the conductor 4 and not on the frequency of the current.

Figure 3:
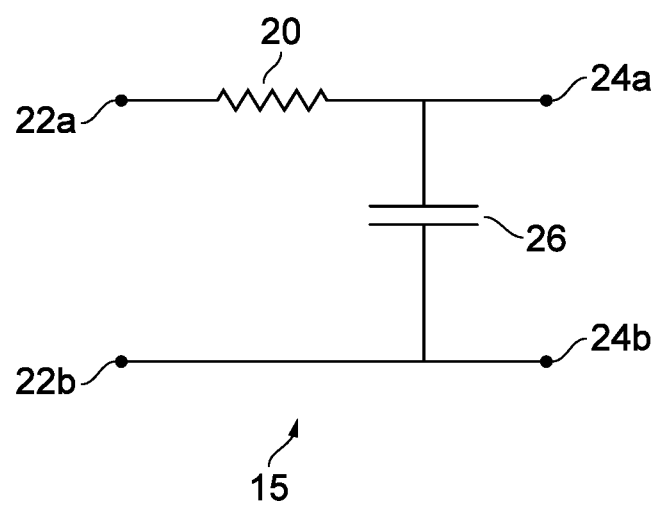
FIG. 3 is a circuit diagram of a single pole Butterworth RC filter.

The person skilled in the art is aware of low pass filters. FIG. 3 is a circuit diagram of a first order Butterworth low pass RC filter 15 comprising a resistor 20 and a capacitor 26. The filter comprises a pair of input nodes 22a and 22b and a pair of output nodes 24a and 24b. The resistor 20 extends between the input node 22a and the output node 24a. The capacitor 26 extends between the output node 24a and the conductor connecting nodes 22b and 24b.

Figure 4:
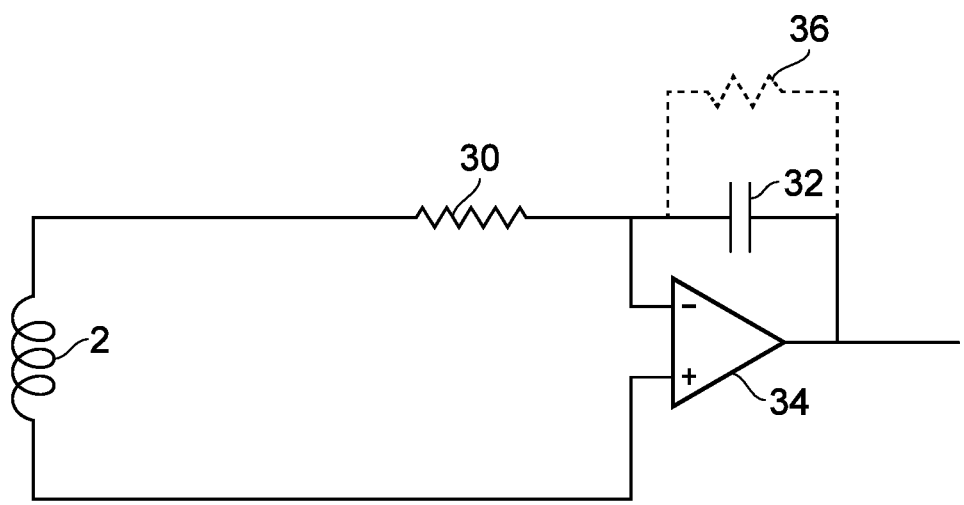
FIG. 4 is a circuit diagram of a Rogowski coil in association with and an analog integrator.

It is known that Butterworth filters can be provided in a number of "orders" and that text books show the magnitude function for an $N_{th}$ order Butterworth low pass filter as $$\frac{V_o}{V_I} = \frac{1}{\sqrt{1+\left(\frac{\omega}{\omega_c}\right)^{2n}}} \qquad \text{Equation 2}$$

where $\omega$=angular frequency
$\omega_c$=cut off frequency $2\pi f_o$
$V_O$=output voltage
$V_I$=input voltage The first order Butterworth response is an integrator-like response which can be coupled to the output of a Rogowski coil to linearize the response of such a circuit as a function of frequency. The Butterworth filter 15 is often implemented as a "leaky" integrator as shown in FIG. 4. The integrator comprises an RC filter combination formed by resistor 30 and capacitor 32 around an operational amplifier 34. In order to stop the integrator integrating endlessly and thereby risking running into its supply rails a further resistor 36 (shown in dotted line) is provided in parallel with the capacitor 32 that causes it to leak some of its charge away.

A problem with the circuit is that the magnitude of the output signal depends critically on the value of the RC product of resistor 30 and the capacitor 32. In order to understand this, consider FIG. 5 which shows an idealized response from the Rogowski coil current transducer as represented by chain line 40 which increases as function of frequency. Suppose, for example that we team this response up with a first order Butterworth filter having a cut-off frequency which is nominally $F_0$. The frequency responses are routinely represented on a log-log plot where the skilled person knows that for a first order low pass filter the frequency response falls off at 20 dB per decade. In simplistic terms, the graph is constructed such that the frequency response of the filter stays flat with zero insertion loss until the break point, and then falls at 20 dB per decade of frequency increase. We will come back to this simplification later. However, it can be seen that if process or temperature variation causes the RC product to vary such that the cut off frequency moves from $F_0$ to $F_1$ then the attenuation introduced by a filter at a given frequency decreases. For example, if we wish to measure the amplitude of a frequency at frequency $F_m$, for example 50 Hz, then the cut of frequency of $F_0$, the gain (or really the attenuation) introduced by the filter can be represented by $G_0$ at $F_m$. However, if the filter cut off frequency increases to $F_1$, then the gain of the filter increases to $G_1$ at frequency $F_m$ (or more intuitively the attenuation inserted by the filter has reduced). Similarly, if the RC components vary such that the break point decreases in frequency from $F_0$ to $F_2$ then the filter response at frequency $F_m$ is represented by gain $G_2$.

It's worth considering the effect of these numbers in detail.

Current measuring circuits often specified to a certain degree of decision. For example, a circuit may be specified to measure to within 0.1% accuracy, i.e. 1 part in 1000.

Figure 5:
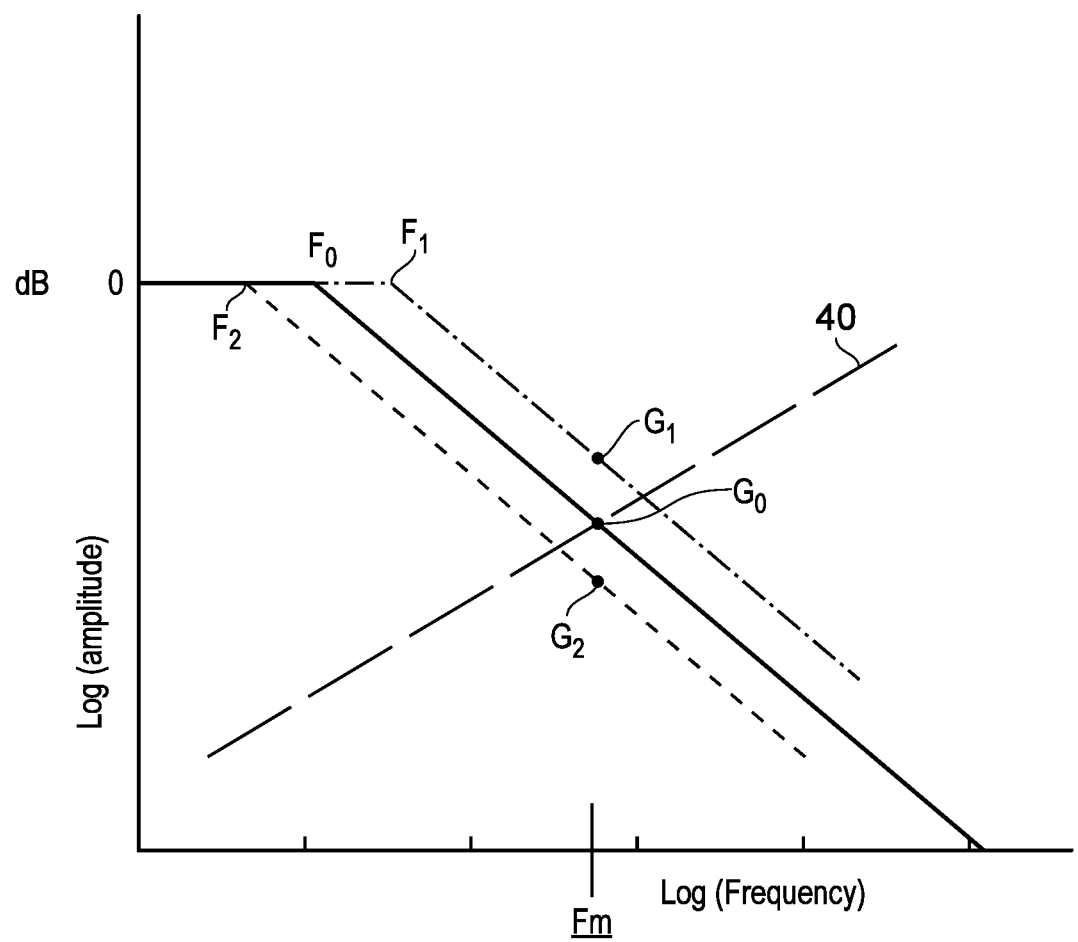
FIG. 5 is a graph illustrating how a change in the break-point (−3 dB frequency) of the filter can affect the measured amplitude of a current at a specific frequency.
Figure 6:
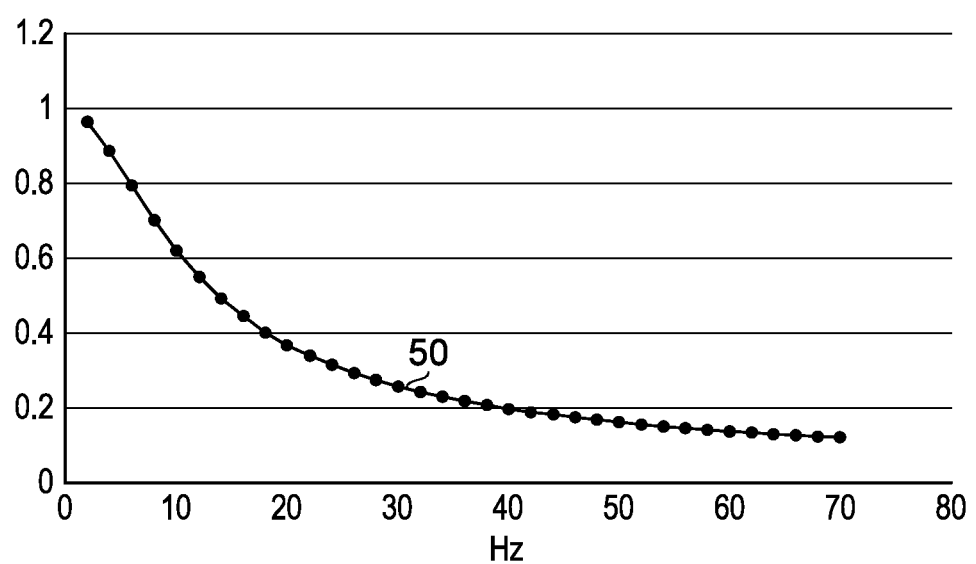
FIG. 6 is a plot of the magnitude of the filter as a function of frequency on a linear-linear scale for a filter having a cut-off frequency of 8 Hz.

If rather than using the graphical approach of the log-log plot of FIG. 5 we calculate the frequency response for a first order low pass filter and plot it on a linear-linear scale as shown in FIG. 6 by curve 50 it becomes apparent that the gradient of the filter changes more rapidly near the break-point and then changes less rapidly as the frequency moves further away from the break-point. FIG. 6 was plotted for a first order filter having a nominal break-point at 8 Hz. For such a filter the gain of the filter at 50 Hz can be calculated using Equation 2 and corresponds to 0.157991. However, if R or C were to vary such that the break point moved from 8 Hz to 9 Hz, then the gain at 50 Hz would be 0.177153. This corresponds to a change of 12% in the magnitude response of the filter at the measurement frequency. Where the resistor and capacitor components are fabricated using integrated circuit technologies, the components could be matched to great accuracy. However the absolute values of the resistor and capacitors can vary wildly from wafer to wafer, with changes of 20% or more having to be tolerated which gives rise to changes in the magnitude response of the filter much larger than the permissible measurement tolerance limit. It may be possible to calibrate at manufacture the response of the signal chain, either by trimming the components or calculating and storing a correction factor to be applied, but this may only be useful if the system remains stable forever. Furthermore, packaging stress and ambient temperature can also cause component values to change. Thus, whilst it may be possible to integrate all or part of an RC filter onto an integrated circuit it is exceptionally difficult to actually set it to a particular value without having to undertake expensive trimming. Even then, the circuit value in terms of the RC product is liable to drift with temperature. It should be noted that part of the filter may be implemented using off-chip (discrete) components.

Figure 7:
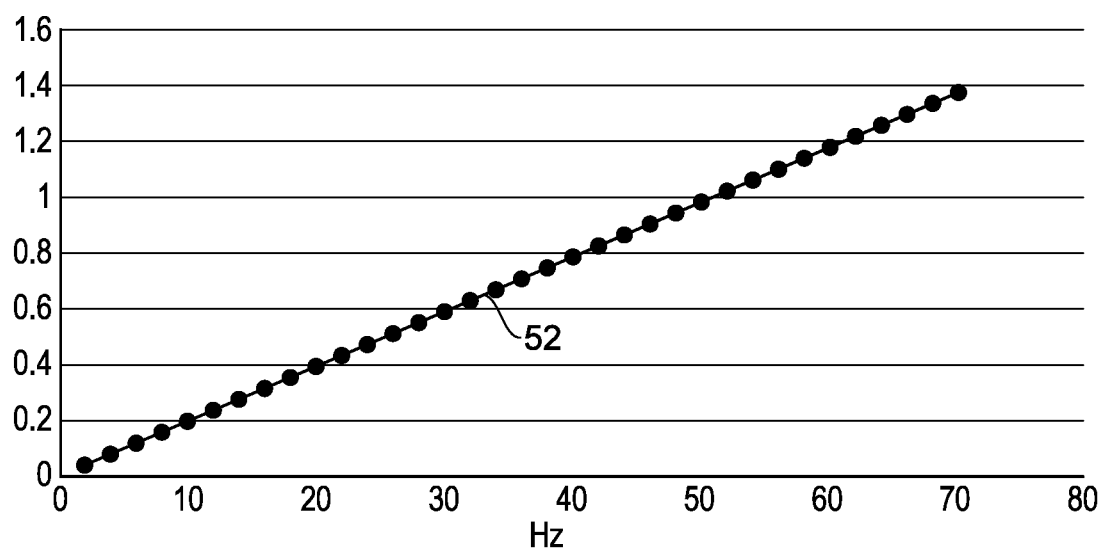
FIG. 7 is a plot of the output voltage of a Rogowski coil (in arbitrary units) on a linear-linear scale.
Figure 8:
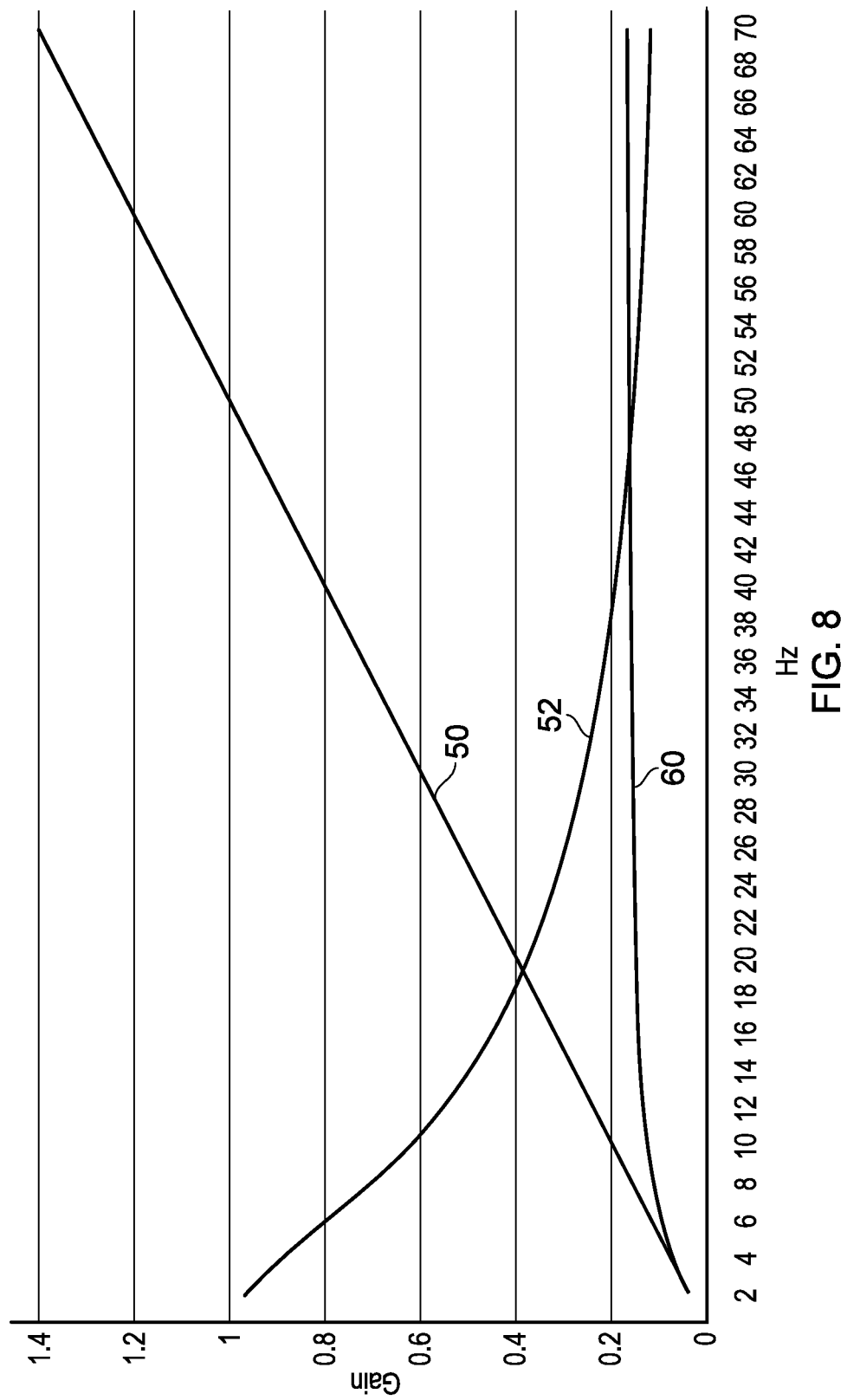
FIG. 8 is a plot combining the data shown in FIGS. 6 and 7, and showing the product thereof as a function of frequency.

FIG. 7 schematically illustrates a response of the Rogowski coil 2 as line 52 on a linear-linear scale and FIG. 8 reproduces the information of FIG. 6 and FIG. 7, and also plots their product, indicated by curve 60. It can be seen that the product 60 of the low pass filter response as represented by line 50 and the Rogowski coil response as line 52 becomes relatively constant with frequency, especially so once the frequency has moved a reasonable distance from the cut off frequency of the low pass filter.

Figure 9:
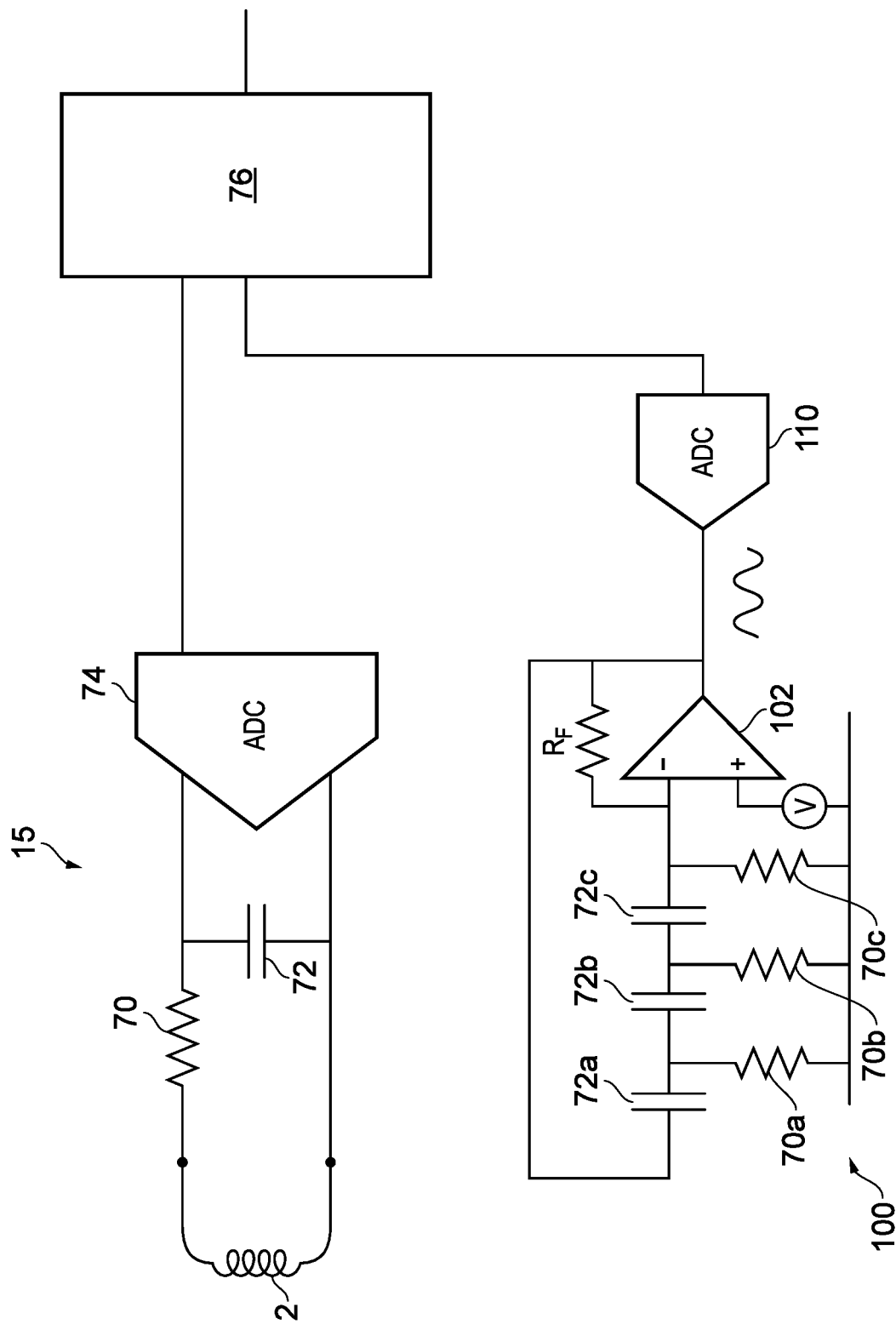
FIG. 9 shows an embodiment of an apparatus in accordance with the teachings of the present disclosure.

It can be seen that it would be desirable to be able to accurately characterize the RC product of the low pass filter. FIG. 9 schematically illustrates a circuit where RC component combination, this time represented by resistor 70 and capacitor 72 act as a low pass filter, and then the output of the filter is digitized by an analog to digital converter 74 before being passed to a processing block 76 in order to output an estimate of a measured current as detected by the Rogowski coil 2. As noted before, the problem exists that the estimate of current depends on the transfer function of the RC filter. It is therefore highly desirable to know the RC product of the resistor 70 and capacitor 72. The Rogowski coil may be replaced by an air-cored current transformer with a burden resistor.

As noted before, capacitors and resistors can be matched exceptionally well within an integrated circuit or reasonably well when collocated as discreet passive components from the same manufacturer outside the IC Therefore, one approach is to form replica copies of the capacitor 72 and the resistor 70 in a circuit which is intended to characterize the RC response. As such the circuit, here generally designated 100, can be regarded as a characterization circuit. In the embodiment shown in FIG. 9 the characterization circuit comprises three replica capacitors 72a, 72b and 72c and three replica resistors 70a, 70b and 70c arranged to introduce phase shifts within a feedback loop of an operational amplifier 102. Each stage in this network is required to insert a phase shift of 60°, and it can be shown, either by analysis or by reference to text books that $$F_r = \frac{1}{2\pi RC\sqrt{2N}}$$ Equation 3 where all the resistors 70a to 70c=R
all the capacitors 72a to 72c=C
N=number of stages
$F_r$=resonance frequency Thus the self-sustaining oscillator within the characterization circuit 100 has a frequency which is reliably related to the RC time constant of the capacitors 72 and resistors 70 within the filter 15. An output from the oscillator can be digitized by an analog to digital converter 110 and then processed by the processor 76 to accurately determine the frequency of operation. The values of the capacitors in the characterization circuit 100 do not necessarily need to be the same as the values of the capacitors in the filter circuit 15. Thus smaller capacitors may be used resulting in a higher oscillation frequency which takes less time to accurately characterize. Similarly the resistors can also be smaller. Thus the characterization circuit need not take up such a significant amount of die area as the filter.

Figure 10:
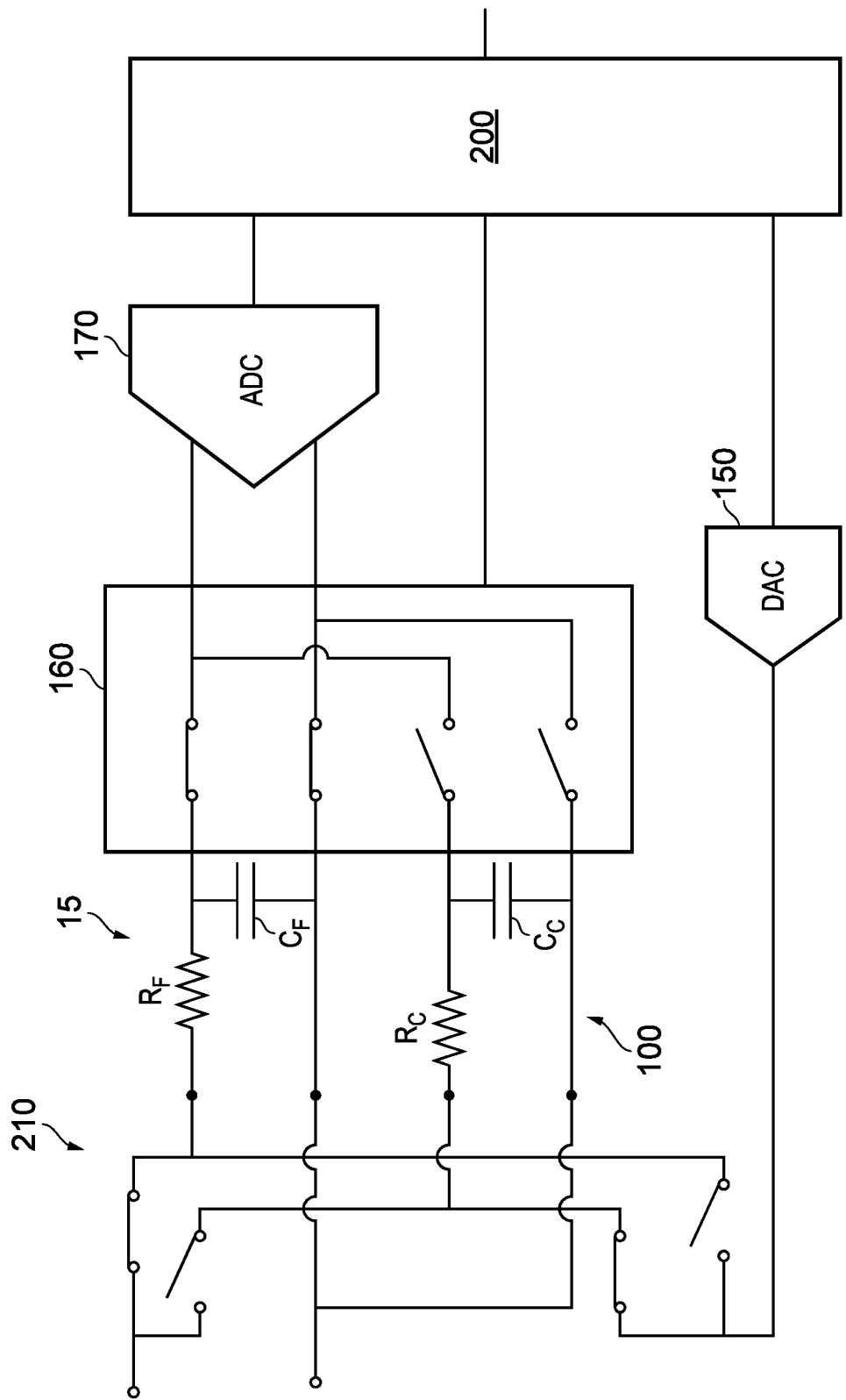
FIG. 10 shows a further embodiment.

As an alternative, both the filter 15 and the characterization circuit 100 may be fabricated to have identical R and C components, as shown in FIG. 10. Here the filter components are designated as $R_f$ and $C_f$ and the corresponding filter in the characterization circuit is designated $R_c$ and $C_c$ with the intention that $R_f=R_c$ and $C_F=C_c$. The filter within the characterization circuit 100 may be driven with an oscillating signal with a digital to analog converter 150 and the output of the filter may be provided by way of a multiplexer 160 to an analog to digital converter 170. The control signals to the digital to analog converter 150 and the results from the analog to digital converter 170 may stem from and be provided to a processor 200. As a consequence the processor 200 can accurately characterize the response of the RC circuit within the characterization circuit 100. Additionally, if required, an array of switches acting to form a swapping circuit 210 may be provided such that the input signal can be swapped to the filter formed by $R_c$ and $C_c$ and that the DAC 150 may be used to drive the filter formed by $R_f$ and $C_f$. Thus, from time to time functionality of the filter 15 and the characterization circuit 100 can be swapped such that each can be accurately characterized and then drift in one of the circuits can be used to compensate for a corresponding drift to the other one of the circuits. By knowing the correct RC time constant then the gain/attenuation and phase shift provided by the filter, irrespective of the filter configuration or number stages can be quickly calculated thereby allowing a circuit, such as a current measuring circuit, to be characterized to a required accuracy even though the absolute values of the resistors and capacitors used within the filter may vary by 20 or more percent from product to product.

Figure 11:
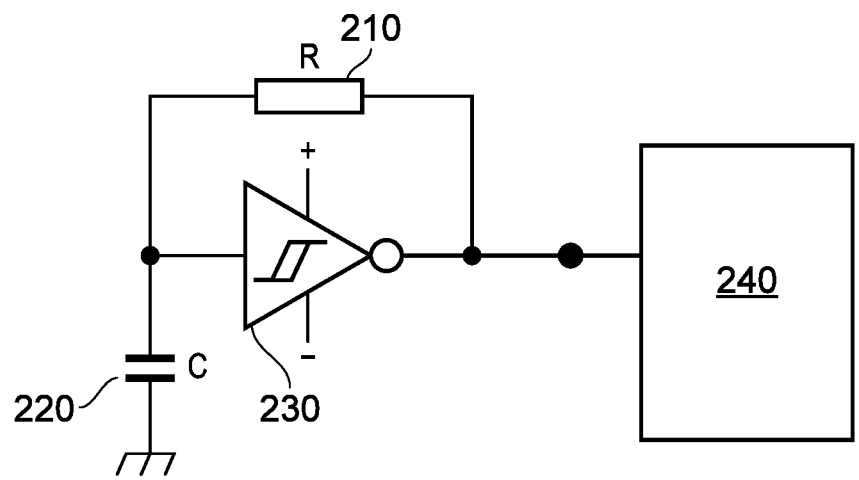
FIG. 11 illustrates a further embodiment of an oscillator.

The characterization need not require multiple copies of the RC filter to form an oscillator. FIG. 11 shows an oscillator circuit where a resistor 210 and a capacitor 220 are provided in a feedback loop around a Schmidt inverter 230 so as to form an oscillator. The output of the inverter 230 is a square wave which as a logic signal can be monitored directly by a processor 240 so as to estimate the frequency of the square wave. Alternatively the output of the inverter may be provided to an ADC to digitize it, or to a logic circuit, such as a divide by two counter, to clean its edges and equalize the mark-space ratio thereof prior to having the frequency of the signal estimated.

Once the data processor can determine the actual response of the low pass filter it can apply a gain correction. Thus supposing that the RC component as measured by the oscillator drifted upwardly by 1% as a result of ambient or other temperature change, and that corresponded to the measured output being X % higher at the measurement frequency (mains frequency) then a corresponding attenuation can be introduced into the signal chain to compensate for the RC drift.

Thus the estimate of current can be corrected.

In the context of Rogowski coil (or air-cored current transformer) based current consumption meters (or watt-hour meters) this approach can be used to improve their performance. Thus approach may be used in conjunction with techniques described in WO2013/038176, "current measurement", where a known additional current can be superimposed on a load current, and then the response of the measurement transducer and associated signal processing chain is examined to deduce the transfer function of the measurement transducer and signal processing chain, or at least to monitor for changes in the transfer function.

The teachings disclosed herein can be used with an $$\frac{dI}{dt}$$

based transducer and integrator combination to monitor for response changes due to heating or aging, and/or to allow correction factors to be calculated and applied, or component values to be electronically trimmed where, for example, the capacitor is made of a plurality of smaller capacitors and associated switches for selectively removing or adding capacitors into a group of capacitors.

The monitoring of the integrator response by a replica characterization circuit can be applied in many areas of technology, such as motor control, automotive, aerospace and medical systems, metering and protective systems (relays and circuit breakers) and the like.

The filter 15 (see FIG. 9) by its nature introduces a delay in processing the input signal, and this can be disadvantageous if some remedial action needs to be taken on an urgent basis, for example to apply protective measures in the event of an overcurrent or overvoltage event. In such an arrangement the signal from the air core current transformer or Rogowski coil may be provided directly to a protection circuit without passing through the low pass filter such that the protection circuit can make a decision about initiating a protective action as quickly as possible.

Once a filter response is characterized the filter can be used to help estimate other parameters such as a magnitude of a surge current or surge voltage. The RC filter provides a linearization of the frequency response from the Rogowski coil or similar inductor based current transducer. In normal operation the output of the filter will be a sinusoid. However in the event of an electrostatic discharge event, such as a lightning strike on a power distribution system, current surges may be caused to flow. The magnitude of a current surge at any point in the distribution system may vary as a function of distance from the point of the lightning strike, and may also depend on the number of intervening current splitting nodes or devices such as transformers. The surge current will be a largely unidirectional event and hence the voltage on the capacitor may become elevated, and then decay away in an exponential manner as set out by:

$$V(t)=Vs \exp(-t/RC) \quad \text{Equation 4}$$

Where

V(t) is the voltage at time t after the surge event at $T_0$, and

Vs is the surge voltage at time $T_0$

By examining the evolution of V(t) as a function of time, and with some estimate of elapsed time since the surge event occurred, it becomes possible to estimate the magnitude of the surge current. This requires knowledge of the RC time constant of the filter, but this information becomes available as a result of the operation of the present disclosure. The value Vs may also depend on the duration of the surge event. The duration may be measured by a circuit that runs a counter-timer to time the duration for which the signal exceeds a threshold, or the duration of the surge event, such as lightning strike, may be assumed to be constant.

Figure 12:
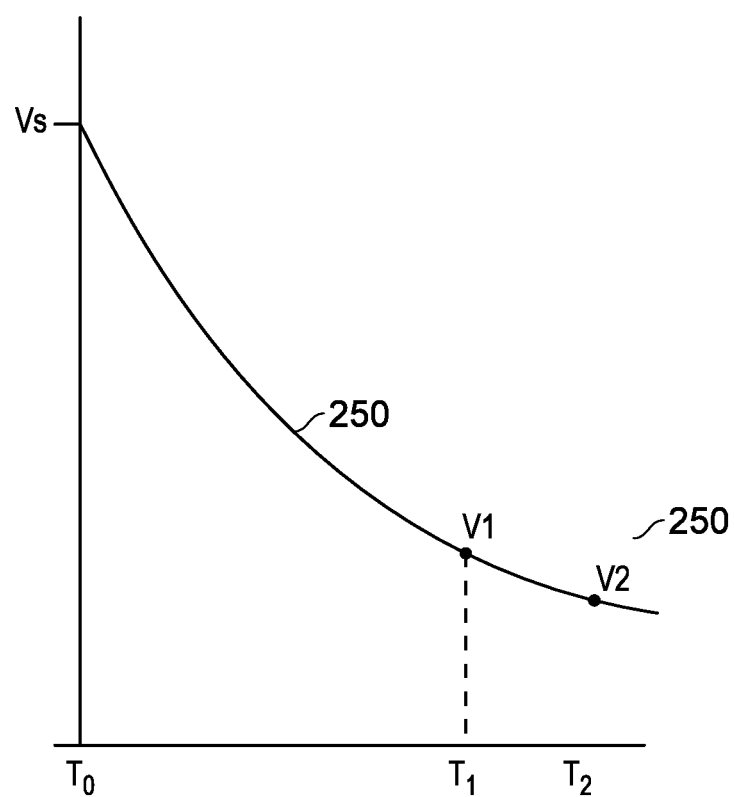
FIG. 12 illustrates the evolution of voltage across the capacitor as a function of time in response to a surge event.

FIG. 12 shows the evolution as a function of time of the voltage stored on the capacitor 26 of FIG. 3 following the occurrence of a surge current and as the voltage decays away. For the purposes of illustration the sinusoidal response from the filter has been omitted but if a mains-borne current is being detected then the sinusoidal response thereof will be superimposed on the exponential decay, represented by line 250 of the voltage across the capacitor.

If the time $T_0$ of the surge event can be captured by a detector, such as by a voltage monitoring circuit that connects directly to the sensor or to some other arrangement that detects the voltage or current spike of the surge (or the occurrence of its peak value within the filter) and the elapsed time to $T_1$, where the voltage is measured is known, then by knowledge of the RC time constant the surge voltage $V_s$ at time $T_0$ can be calculated. The accuracy of timing can be verified or improved by taking further voltage measurements, such as V2 at time $T_2$. The measurements can then be fitted to an appropriate function, such as an exponential delay or to a sync function. Thus an estimate of the energy in the surge event may be made.

If desired, multiple RC filters having different time constants could be used to the evolution of their respective decay voltages as a function of time should intersect at the time of the surge event.

Figure 13:
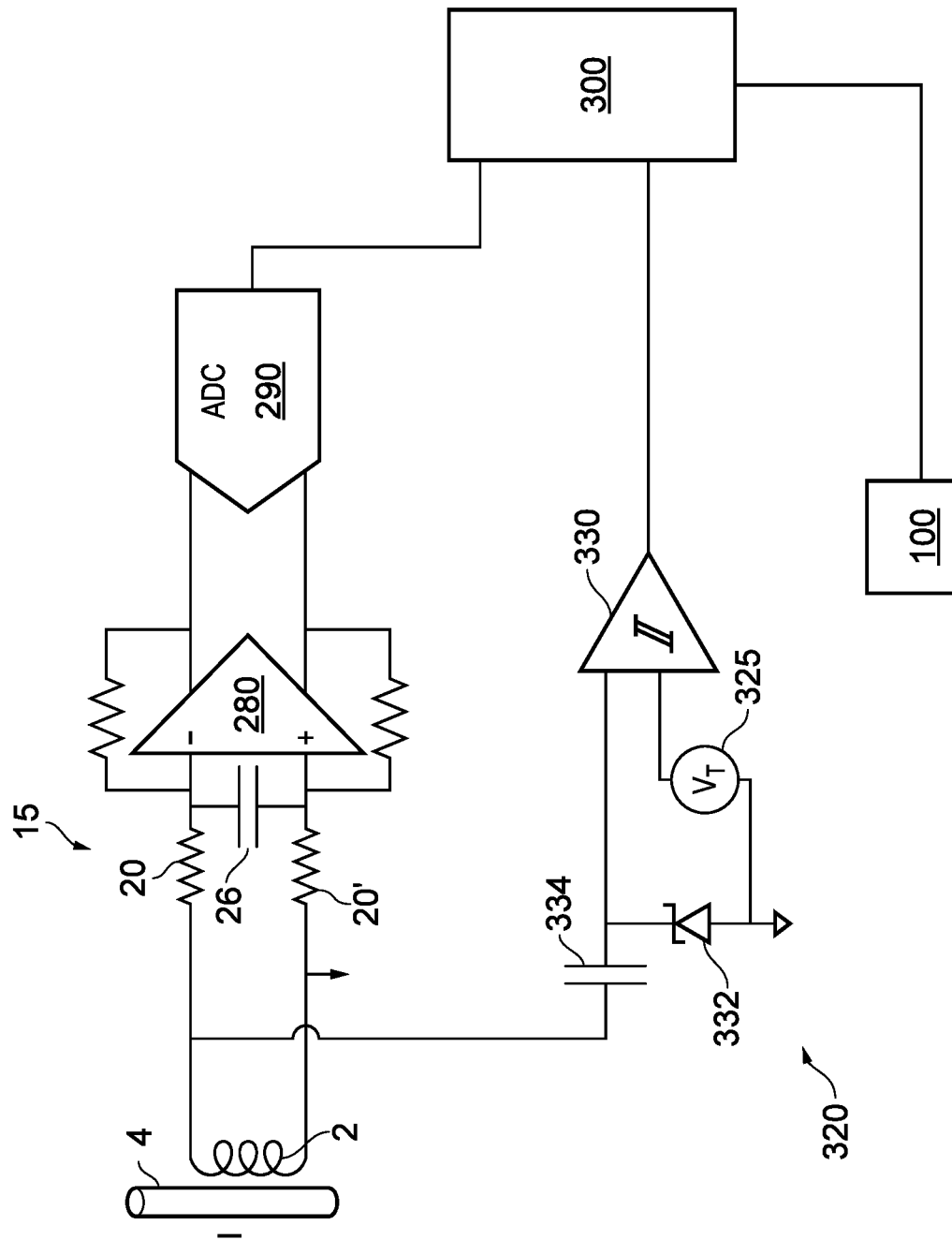
FIG. 13 illustrates a further embodiment of the present disclosure.

FIG. 13 schematically illustrates a further embodiment of the present disclosure. As with the earlier Figures, a current carrying conductor 4 is associated with an inductive sensor 2, such as a Rogowski coil. A voltage developed across the Rogowski coil is filtered by a low pass filter comprising the resistors 20, 20' and the capacitor 26. The low pass filter is, in this embodiment, provided as a differential filter at the input to a difference amplifier 280. An output of the difference amplifier 280 is provided to a differential ADC 290 which converts the differential output of the difference amplifier 280 into a digital code. Thus, the operation of this circuit is analogous to that described with respect to FIG. 9 except that it is fully differential. The time constant of the filter 15 can be estimated by a data processor 300 responsive the output of the characterization circuit 100. The characterization circuit may be formed as described hereinbefore.

In normal use the data processor 300 is responsive to the output of the ADC 290 so as to estimate the alternating current carried by the conductor 4.

The arrangement shown in FIG. 13 is further modified by the inclusion of a transient event detector, generally designated 320 which acts to monitor the output voltage across the Rogowski coil and if it exceeds a target value, as set by voltage source 325 outputting the voltage $V_t$, then a digital signal is output by a comparator 330 indicating that the transient event may be occurring. This gives a timing reference equivalent to time stamping the time $T_0$ of FIG. 12, and may also allow the duration of the surge event to be estimated. The data processor 300 can then monitor the evolution of the voltage across the capacitor 26 as a function of time. Based on the evolution of this voltage, together with an estimate of the RC time constant the data processor 300 can estimate the magnitude of the surge. This is useful as it is indicative of whether components in, for example, an electricity distribution system are likely to have been damaged by the surge event or whether the surge event was within their current handling capability. The comparator 330 may be protected by way of a voltage clamp, schematically illustrated by way of zener diode 332. The transient detector 320 may also include a DC blocking capacitor 334 to provide further protection against transient events.

Although the teachings have been presented with respect to inductive current transducers, the teachings relating to estimating the transfer function of a filter or circuit, and using this to estimate the magnitude of a surge current can be applied to estimating the size of over-voltage events or any other measured exception that is converted into the electrical domain by a suitable transducer.

It is thus possible to provide a method and apparatus for accurately characterizing the filter response where the values of the filter are not well known, but the change in their value can be accurately matched to the change in values in a corresponding interrogation circuit.

Figure 14A:
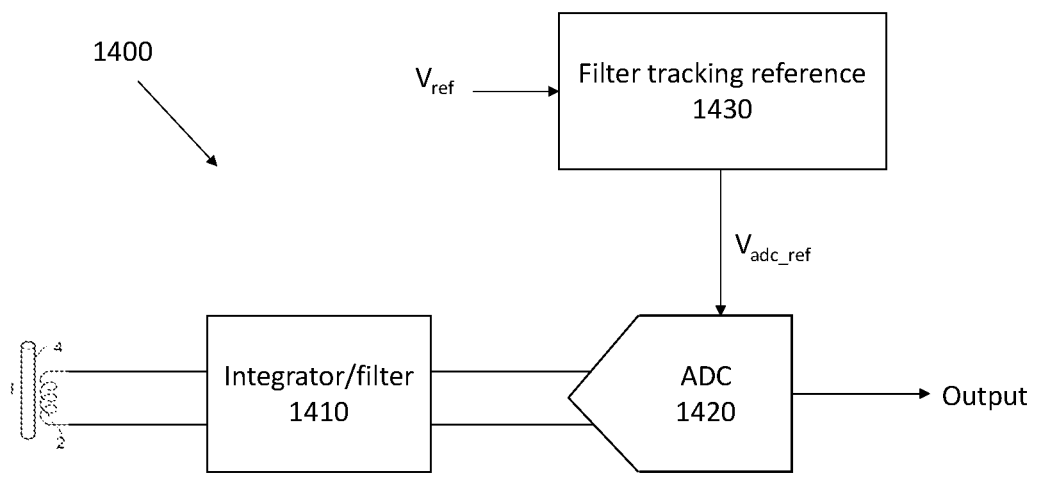
FIG. 14A illustrates a further embodiment of the present disclosure.

FIG. 14A shows a system 1400 in accordance with a further aspect of the disclosure. The system 1400 comprises a coil based current transducer, such as a Rogowski coil/ air-cored current transformer 2, coupled to an apparatus that comprises an integrator/filter 1410, an analog to digital converter (ADC) 1420 and a filter tracking reference generator 1430. The integrator/filter 1410 may be a single ended or differential circuit and may, for example, be a low-pass filter such as those represented in any of FIGS. 3, 4, 9, 10 and 13. The ADC 1420 may be implemented as a single-ended or differential ADC and is coupled to the integrator/ filter 1410 and configured to digitally convert the filtered signal output by the integrator/filter 1410. As explained with respect of FIG. 5, a change in value of the filter components of the integrator/filter 1410, such as the values of R and/or C, may change the frequency response of the integrator/filter 1410 by changing the break point. This in turn changes the gain of the integrator/filter 1410 for signals that are within the frequency range of range of operation (also referred to has the frequency range or region of interest), for example signals that are greater than the break point frequency, such as the frequency $F_M$ in FIG. 5. Similarly to the arrangements represented in FIGS. 9 and 10 that are described above, the arrangement of FIG. 14A is configured to correct for such changes in the frequency response of the integrator/filter 1410, such that within the operational frequency range (the range/region of interest) the overall gain of the system remains substantially constant/stable, such that it is substantially unaffected by changes in the values of the filter components. However, unlike the arrangements of FIGS. 9 and 10, the system 1400 does not have a characterizing circuit configured to characterize the filter components and a separate mechanism for correcting for any changes in frequency response of the integrator/filter 1410. Instead, it effectively combines correction and filter value tracking into a single unit/circuit, which is the filter tracking reference generator 1430.

The filter tracking reference generator 1430 is configured to generate a reference voltage $V_{adc\_ref}$ for the ADC 1420. The reference voltage $V_{adc\_ref}$ effectively defines the magnitude of the voltage represented by each digital code output by the ADC 1420. When the magnitude of $V_{adc\_ref}$ decreases, the magnitude of the voltage represented by each digital code decreases, meaning that for a given voltage at the input to the ADC, a reduction in $V_{adc\_ref}$ results in more digital codes at the output. As a result, decreasing the size of $V_{adc\_ref}$ effectively increases the gain of the ADC 1420.

The inventors have therefore configured the filter tracking reference generator 1430 to generate $V_{adc\_ref}$ to be dependent on the value of at least one of the filter components in the integrator/filter 1410. The nature of the dependency is such that a change in the value of a tracked filter component that changes the gain of the integrator/filter 1410 also results in a change in the magnitude of $V_{adc\_ref}$, which effectively adjusts the gain of the ADC 1420 in the opposite direction to the change in gain of the integrator/filter 1410, thereby correcting for the change in the integrator/filter 1410. For example, if the gain of the integrator/filter 1410 increases, the magnitude of $V_{adc\_ref}$ increases so that the gain of the ADC 1420 decreases.

Figure 14B:
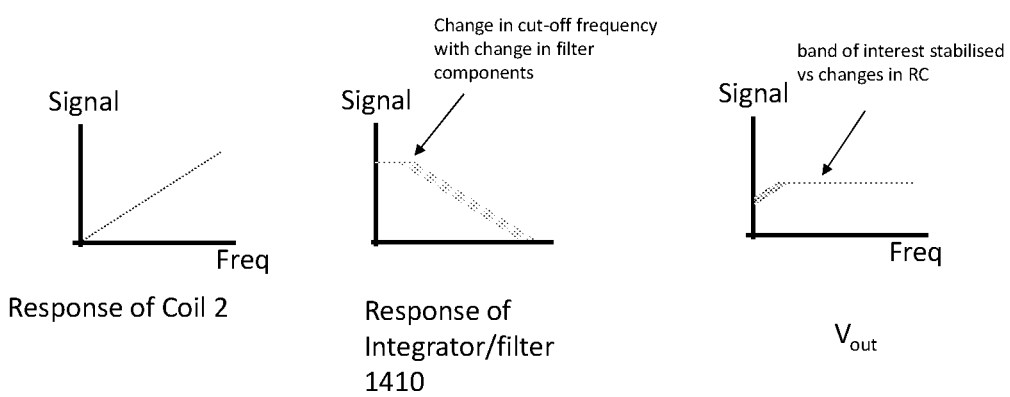
FIG. 14B shows frequency response characteristics of various parts of the embodiment of FIG. 14A.

FIG. 14B shows a representation of the frequency response of the coil 2, the integrator/filter 1410 and the overall system ($V_{out}$). The frequency response of the coil 2 and the integrator/filter 1410 is as described earlier with reference to FIG. 5. FIG. 14B shows three different example cut-off/break point frequencies for the integrator/filter 1410, caused by changes in the value of filter component (eg R and/or C). In this example, an increase in R and/or C results in the break point reducing in frequency, thereby effectively reducing the gain of the filter in the operational frequency range (ie, reducing the gain for signals at frequencies that are greater than the cut-off frequency). However, any change in the value of a filter components, for example caused by temperature and/or component drift over time, causing a change in gain of the integrator/filter 140, are corrected by a corresponding change in the ADC reference voltage $V_{adc\_ref}$ causing a correcting change in gain of the ADC 1420. The result of this can be seen in the frequency response of the overall system $V_{out}$, where in the operational frequency range the gain is substantially constant and unaffected by changes in the values of the filter components.

In order to achieve this effect, the filter tracking reference generator 1430 may comprise one or more tracking components that are matched to the filter components of the integrator/filter 1410. For example, if the integrator/filter 1410 includes a resistor and capacitor, the tracking components may include a matched resistor and/or a matched capacitor. The matched components may be the same size as the filter components, or a scaled version, or a component from a similar family of components using the same materials. Where the filter components are fabricated using integrated circuit technologies, the matched components may be fabricated in the same way and on the same IC. Where filter components are off chip components, the matched components may also be off chip components having the same design/technology. As a result, any changes over time in the value of the filter components should be substantially replicated by the tracking components. The filter tracking reference generator 1430 is configured to generate $V_{adc\_ref}$ to be dependent on the value of the tracking components, and therefore by extension dependent on the value of the filter components.

Figure 14C:
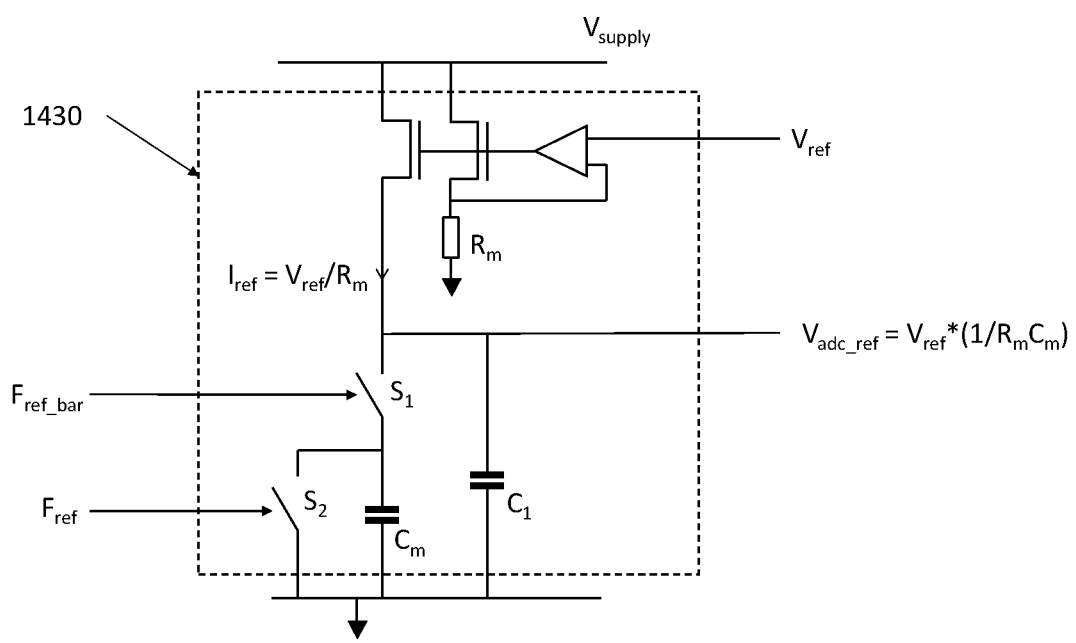
FIG. 14C shows an example implementation of a filter tracking reference circuit.

FIG. 14C shows one non-limiting example design for the filter tracking reference generator 1430. In this example, the filter tracking reference generator 1430 is configured for use in a system where the integrator/filter 1410 is a low-pass filter having a resistor and capacitor. The filter tracking reference generator 1430 receives a fixed voltage reference $V_{ref}$ (such as one generated by a band-gap reference, or any other suitable voltage reference source) and modifies it to be dependent on the value of a tracking resistor $R_m$, which is matched to the resistor in the integrator/filter 1410, and the value of a tracking capacitor $C_m$, which is matched to the capacitor in the integrator/filter 1410. In this particular example, $V_{ref}$ is converted to a current $I_{ref}$ using a V-to-I converter arrangement. The V-to-I converter arrangement is configured such that $I_{ref}$ is dependent on the inverse of $R_m$ (i.e., if $R_m$ increases, $I_{ref}$ decreases). $I_{ref}$ is then converted back to a voltage $V_{adc\_ref}$ using a switched capacitor arrangement that includes the tracking capacitor $C_m$ that when switched at a switching frequency $F_{ref}$ represents an equivalent resistance that is $1/(C_m F_{ref})$. As a result, $V_{adc\_ref} = I_{ref}/C_m = V_{ref} * (1/R_m C_m F_{ref})$. Consequently, $V_{adc\_ref}$ is dependent on the inverse of $R_m$ and $C_m$. It will be appreciated that the switch control signals $F_{ref}$ and $F_{ref\_bar}$ may be set at to any suitable fixed switching frequency $F_{ref}$ in order to achieve a desired effective impedance of the switched capacitor $C_m$. The switch control signals may be generated and controlled by any suitable controller device/ circuit, which is not represented in FIG. 14C for the sake of simplicity. The capacitor $C_1$ functions as a smoothing capacitor, for the peaks of current that come from the equivalent circuit of the switch capacitor resistor and may be set to any suitable value. More complicated filters, such as discrete time notch filters may optionally also be used to help remove such ripple. Optionally, the filter tracking reference generator may also be buffered before driving the ADC 1420 to reduce the effect of its impedance on the response of the filter tracking reference generator 1430.

Whilst FIG. 14C shows one particular example circuit that may be used to generate $V_{adc\_ref}$ it will be appreciated that various other circuits could alternatively be used to generate a reference voltage that is dependent on the tracking components. It should be noted that if, for example, one component is particularly stable, the filter tracking reference generator 1430 could be made to predominantly track only the least stable component and still bring substantial benefit to the system stability, as described in more detail later. Furthermore, whilst in this example $V_{adc\_ref}$ is substantially proportional to the inverse of the value of the tracking components (which is suitable for tracking the filter components of an integrator/low pass filter), an alternative characteristic may be desirable. For example, the filter tracking reference generator 1430 may be configured to output a voltage reference $V_{adc\_ref}$ that is substantially proportional to the value of the tracking components, for example if the filter/integrator 1410 were configured as a high pass filter. This example may be particularly useful where the apparatus is configured for connecting not to the coil 2, but to a different type of a device/component that has a frequency response that is opposite to that of the coil 2.

Figure 15A:
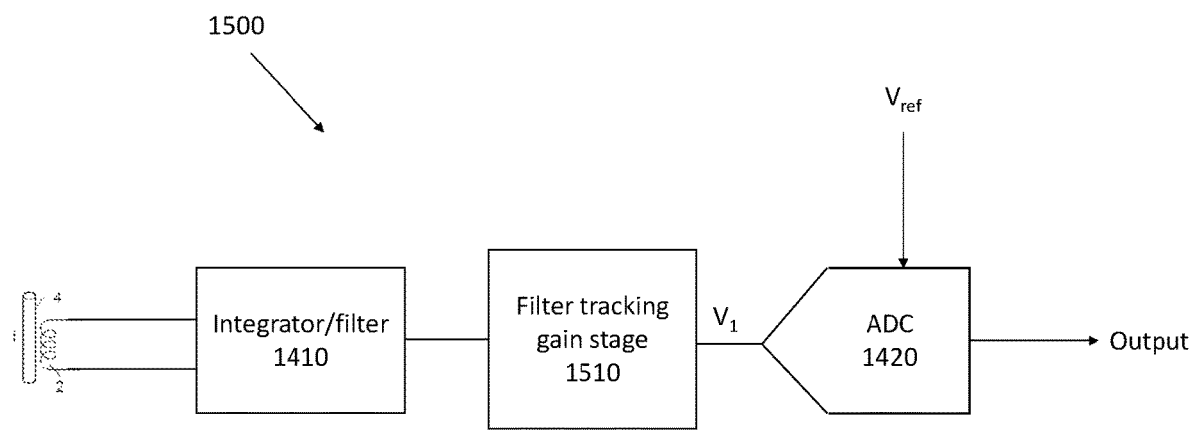
FIG. 15A illustrates a further embodiment of the present disclosure.

FIG. 15A shows a system 1500 in accordance with a further aspect of the disclosure. Its purpose is the same as the system 1400 described above, but rather than using an ADC reference voltage that is dependent on the value of the tracking components, it instead uses a filter tracking gain stage 1510 in the signal path, where the gain of the gain stage 1510 is dependent on the value of the tracking components in the gain stage 1510.

The integrator/filter 1410 and the filter tracking gain stage 1510 may be considered together to form a signal processing circuit/unit/module where a signal received at the input (for example, a signal from the coil 2) passes through a signal path that includes both the integrator/filter 1410 and the filter tracking gain stage 1510 and is output to the ADC 1420. Whilst FIG. 15A shows the integrator/filter 1410 preceding the filter tracking gain stage 1510 in the signal path, they may alternatively appear in the opposite order in the signal path. The filter tracking gain stage 1510 is configured to have one or more tracking components that are matched to the filter components of the integrator/filter 1410, such that any change in the value of the filter components should be mirrored by the same changes in the value of the tracking components. The filter tracking gain stage 1510 is configured to have a gain that has a dependency on the value of the tracking components that is opposite to the dependency that the gain of the integrator/filter 1410 has on the filter components. In more detail, if the integrator/filter 1410 is configured as a low-pass filter with R and C filter components, as the value of R and/or C increases, the gain typically decreases for signals that are within the frequency range of interest. In this case, the filter tracking gain stage 1510 is configured to have a gain that is substantially proportional to the value of the tracking components so that any increase/decrease in gain of the integrator/filter 1410 is corrected by a corresponding decrease/increase in gain of the filter tracking gain stage 1510.

Figure 15B:
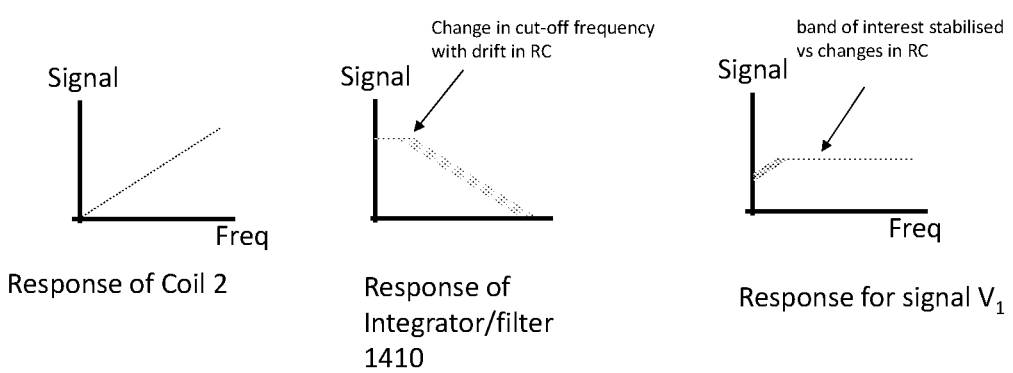
FIG. 15B shows frequency response characteristics of various parts of the embodiment of FIG. 15A.

FIG. 15B shows a representation of the frequency response of the coil 2, the integrator/filter 1410 and the output $V_1$ of the signal processing circuit. The frequency response of the coil 2 and the integrator/filter 1410 is as described earlier. As can be seen, the output $V_1$ has a stabilized gain for signals with frequencies within the operational range, by virtue of the functionality of the filter tracking gain stage 1510. In other words, the filter tracking gain stage 1510 effectively tracks any change in value of the filter components and substantially corrects any change in the frequency response of the integrator/filter 1410 that is caused by a change in the value of the filter components. As a result, the overall gain of the system 1500 should be substantially constant for signals in the operational frequency range and independent of changes in the value of the filter components.

Figure 15C:
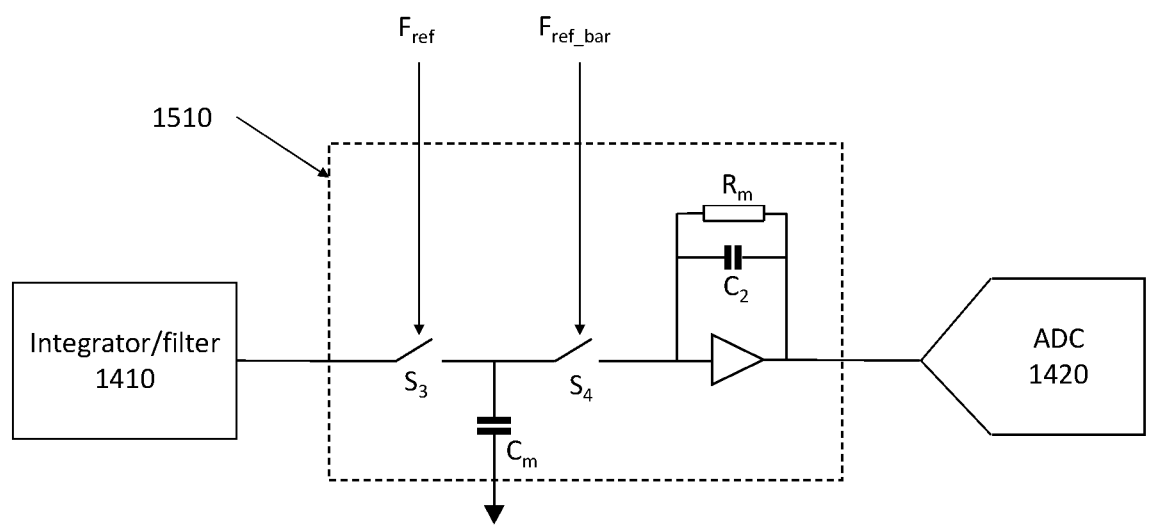
FIG. 15C shows an example implementation of a filter tracking gain stage.

FIG. 15C shows one non-limiting example design for the filter tracking gain stage 1510. In this example, the filter tracking gain stage 1510 is based on an inverting gain configured amplifier with tracking components $C_m$ and $R_m$. The component $C_m$ is a capacitor that is matched to the capacitor in the filter/integrator 1410 and is arranged as a switched capacitor. The component $R_m$ is a resistor that is matched to the resistor in the filter/integrator 1410 and is arranged as a feedback component. In this example, the gain is substantially proportional to the value of both $C_m$ and $R_m$, so as to correct for any changes in the components of the integrator/filter 1410, which in this example is a low-pass filter. However, the filter tracking gain stage 1510 may alternatively be configured to have the opposite gain dependency on $C_m$ and $R_m$, for example if the integrator/filter 1410 were configured to be a high-pass filter.

The gain of this stage is determined by the ratio of the feedback impedance around the amplifier and the input impedance from the switched capacitor equivalent resistor, to the drive impedance, meaning the gain is proportional to $R_m/(1/(C_m F_{ref}))$. It will be appreciated that the switch control signals $F_{ref}$ and $F_{ref}$ bar may be set at design time to any suitable fixed switching frequency in order to achieve a desired effective impedance of switched $C_m$. The switch control signals may be generated and controlled by any suitable controller device/circuit, which is not represented in FIG. 15C for the sake of simplicity. The capacitor $C_2$ may be set to any suitable value needed to smooth out the ripple from the switched capacitor input. Other smoothing filter approaches may additionally or alternatively be used.

In the arrangements of FIGS. 14A and 15A, a filter tracking circuit (eg, the filter tracking reference generator 1430 in FIG. 14A and the gain stage 1510 in FIG. 15A) having tracking components matched to the filter components of the integrator/filter 1410, enabling the circuit to track any changes in value of the filter components. The filter tracking circuit is configured to modify an input to the ADC 1420 in a way that is dependent on the value of the tracking components and which results in a change to the digital conversion performed (either by changing the size of the ADC reference voltage or the size of the analog input) that corrects any change in gain of the integrator/filter 1410 caused by a change in value of the filter components. Consequently, it can be seen that a single circuit/unit can both track the value of the filter components and exercise a correction to the gain of the system, thereby eliminating the need for a separate characterization circuit.

In both the examples of FIGS. 14 and 15, the filter tracking circuit includes two tracking components—$R_m$ and $C_m$. In an alternative, only one of these components may be matched to their corresponding filter component, with the other arbitrarily chosen. For example, if the integrator/filter 1410 uses a very stable resistor that should not vary significantly over time, there may be a need only to track the value of the capacitor in the integrator/filter 1410. In this case, $R_m$ may be chosen to be a very stable resistor, but of any size, construction and technology. In this case, the "tracking components" in the filter tracking circuit would include only $C_m$, which is matched to the capacitor in the filter and would track any changes in the filter capacitor over time. In an alternative, $R_m$ may be the only "tracking component" and $C_m$ be of arbitrary size, construction and technology if the capacitor used in the filter is very stable (for example, is a capacitor external to the IC in which the filter is located).

As mentioned earlier, the filter tracking circuit, the integrator/filter 1410 and the ADC 1420 may together form an apparatus for coupling to a device such as a Rogowski coil or air-cored current transformer. The circuits/units of the apparatus may all be formed on the same IC, or different ICs and coupled together, or formed using discrete components on a PCB, etc. The apparatus and the a Rogowski coil or air-cored current transformer may together form a system for measuring current.

All of the filter components described in the present disclosure are resistors and capacitors (i.e., RC filters). However, the filter components may alternatively be resistors and inductors (i.e., RL filters) or inductors and capacitors (i.e., LC filters). Likewise, the corresponding tracking components may include any one or more of: a matched resistor, a matched capacitor, a matched inductor.

The techniques discussed herein are applicable components formed in integrated circuits where components can be matched with great accuracy. The techniques can also be applied to discrete components, but some form of preselection to find appropriately matched components may be required.

The claims presented herein are in single dependency format suitable for filing at the USPTO. However it is to be understood that the claims are intended to depend on any preceding claim of the same type except where that is clearly technically infeasible. Thus converting these claims from single dependency to multiple dependency format is not intended to introduce any added matter.

The invention claimed is:

1. An apparatus comprising:
a filter comprising filter components, an input for receiving an input signal and an output for outputting a filtered signal, wherein the filter components comprise a first resistor and a first capacitor;
an analog-to-digital converter, ADC, configured to receive and digitally convert the filtered signal; and
a reference generator coupled to the ADC to supply a reference voltage to the ADC, wherein the reference generator comprises filter tracking components comprising at least one of:
a second resistor that is matched to the first resistor; and
a second capacitor that is matched to the first capacitor,
wherein the reference generator is configured to generate the reference voltage to be dependent on the tracking components in such a way that a change in a frequency response of the filter caused by a change in value of at least one of the filter components is substantially corrected by a change in a digital conversion of the filtered signal resulting from a change in the reference voltage.

2. The apparatus of claim 1, wherein the reference voltage is dependent on an inverse of the filter tracking components such that an increase in value of the filter tracking components reduces the reference voltage.

3. The apparatus of claim 1, wherein at least one of the following applies:
the second resistor is formed using the same fabrication process as the first resistor and is notionally identical to the first resistor; or
the second capacitor is formed using the same fabrication process as the first capacitor and is notionally identical to the first capacitor.

4. The apparatus of claim 1, wherein at least one of the following applies:
the second resistor is formed using the same fabrication process as the first resistor and is a scaled version of the first resistor; or
the second capacitor is formed using the same fabrication process as the first capacitor and is a scaled version of the first capacitor.

5. The apparatus of claim 1, wherein the filter is a low pass RC filter.

6. The apparatus of claim 1, wherein the filter is a leaky integrator.

7. The apparatus of claim 1, wherein the reference generator comprises a switched capacitor arrangement comprising the second capacitor.

8. The apparatus of claim 1, wherein the input of the filter is suitable for coupling to a coil based current transducer.

9. An apparatus comprising:
a signal processing circuit comprising an input for receiving a first signal, an output for outputting a second signal and a signal path for signal to pass from the input to the output, the signal processing circuit comprising:
a filter in the signal path, the filter comprising filter components that comprise a first resistor and a first capacitor; and
a gain stage in the signal path;
wherein the gain stage comprises filter tracking components comprising at least one of:
a second resistor that is matched to the first resistor; and
a second capacitor that is matched to the first capacitor, and
wherein the gain stage is configured to have a gain that is dependent on the second resistor and the second capacitor in such a way that a change in frequency response of the filter caused by a change in value of at least one of the filter components is substantially corrected by a change in the gain of the gain stage.

10. The apparatus of claim 9, wherein the gain of the gain stage is substantially proportional to the filter tracking components, such that an increase in a value of the second resistor or the second capacitor results in an increase in the gain of the gain stage.

11. The apparatus of claim 9, wherein at least one of the following applies:
the second resistor is formed using the same fabrication process as the first resistor and is notionally identical to the first resistor; or
the second capacitor is formed using the same fabrication process as the first capacitor and is notionally identical to the first capacitor.

12. The apparatus of claim 9, wherein at least one of the following applies:
the second resistor is formed using the same fabrication process as the first resistor and is a scaled version of the first resistor; or
the second capacitor is formed using the same fabrication process as the first capacitor and is a scaled version of the first capacitor.

13. The apparatus of claim 9, wherein the gain stage comprises a switched capacitor arrangement comprising the second capacitor.

14. The apparatus of claim 13, wherein the gain stage comprises an inverting amplifier stage comprising the switched capacitor arrangement at its input.

15. The apparatus of claim 9, wherein the input of the filter is suitable for coupling to a coil based current transducer.

16. The apparatus of claim 15, wherein the coil based current transducer is a Rogowski coil or an air-cored current transformer.

17. A system for measuring current, the system comprising:
- an input to a signal path for receiving a signal indicative of a current to be measured;
- a filter in the signal path, wherein the filter is arranged to filter the signal received at the input to the signal path, and wherein the filter comprises at least one filter component;
- an analog-to-digital converter, ADC, arranged to digitally convert the filtered signal, wherein the ADC comprises a first input for receiving the filtered signal and a second input for receiving a reference voltage; and
- a filter tracking circuit comprising at least one tracking component that is matched to the at least one filter component:
- wherein the filter tracking circuit is arranged to modify a signal at the first input or the second input of the ADC in way that is dependent on a value of the at least one tracking component, such that a change in frequency response of the filter caused by a change in value of the at least one filter component is substantially corrected by a change in digital conversion performed by the ADC.

18. The system of claim 17, wherein the at least one filter component comprises one or more of: a first resistor; a first capacitor; or a first inductor,
and wherein the at least one tracking component comprises one or more of: a second resistor that is matched to the first resistor; a second capacitor that is matched to the first capacitor; or a second inductor that is matched to the first inductor.

19. The system of claim 17, wherein the filter tracking circuit is a gain stage located in the signal path and is arranged to apply a gain to the signal passing through the signal path, wherein the gain is dependent on the value of the at least one tracking component.

20. The system of claim 17, wherein the filter tracking circuit is a reference generating circuit configured to generate the reference voltage in such a way that is dependent on the value of the at least one tracking component.

* * * * *